United States Patent
Law et al.

(10) Patent No.: US 10,224,422 B2
(45) Date of Patent: Mar. 5, 2019

(54) METHOD TO FABRICATE QUANTUM DOT FIELD-EFFECT TRANSISTORS WITHOUT BIAS-STRESS EFFECT

(71) Applicant: The Regents of the University of California, Oakland, CA (US)

(72) Inventors: Matt Law, Irvine, CA (US); Jason Tolentino, Irvine, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 14/973,522

(22) Filed: Dec. 17, 2015

(65) Prior Publication Data
US 2016/0181407 A1    Jun. 23, 2016

Related U.S. Application Data

(60) Provisional application No. 62/093,635, filed on Dec. 18, 2014.

(51) Int. Cl.
| | |
|---|---|
| *H01L 29/12* | (2006.01) |
| *H01L 29/15* | (2006.01) |
| *H01L 29/66* | (2006.01) |
| *H01L 29/778* | (2006.01) |

(52) U.S. Cl.
CPC ...... *H01L 29/6697* (2013.01); *H01L 29/158* (2013.01); *H01L 29/66969* (2013.01); *H01L 29/778* (2013.01); *H01L 29/7782* (2013.01); *H01L 29/127* (2013.01)

(58) Field of Classification Search
CPC ............ H01L 29/66977; H01L 29/158; H01L 29/66969; H01L 29/778; H01L 29/7782; H01L 29/127
See application file for complete search history.

(56) References Cited

U.S. PATENT DOCUMENTS

| | | | | |
|---|---|---|---|---|
| 7,288,468 | B2* | 10/2007 | Jang | ............... B82Y 20/00 438/500 |
| 2014/0322901 | A1* | 10/2014 | Huang | ............. H01L 21/02601 438/497 |
| 2015/0014627 | A1* | 1/2015 | Yu | ................. H01L 27/14665 257/13 |
| 2015/0129838 | A1* | 5/2015 | Lewis | ............ H01L 31/035218 257/21 |

OTHER PUBLICATIONS

"Robust, Functional Nanocrystal Solids by Infilling with Atomic Layer" on Nano Lett. 2011, 11 by Liu.*
"Structural, Optical, and Electrical Properties of Self-Assembled Films of PbSe Nanocrystals Treated with 1,2-Ethanedithiol" on ACSNano vol. 2. No. 2, 2008 by Luther.*
"Robust, Functional Nanocrystal Solids by Infilling with Atomic Layer" on Nano Lett. 2011, 11 by Liu (Year: 2011).*

* cited by examiner

*Primary Examiner* — Moazzam Hossain
*Assistant Examiner* — Farun Lu
(74) *Attorney, Agent, or Firm* — Knobbe Martens Olson and Bear, LLP

(57) ABSTRACT

Disclosed herein are embodiments of a method to form quantum dot field-effect transistors (QD FETs) having little to no bias-stress effect. Bias-stress effect can be reduced or eliminated through, as an example, the use of a gas or liquid to remove ligands and/or reduce charge trapping on the QD FETs, followed by deposition of an inorganic or organic matrix around the QDs in the FET.

20 Claims, 13 Drawing Sheets

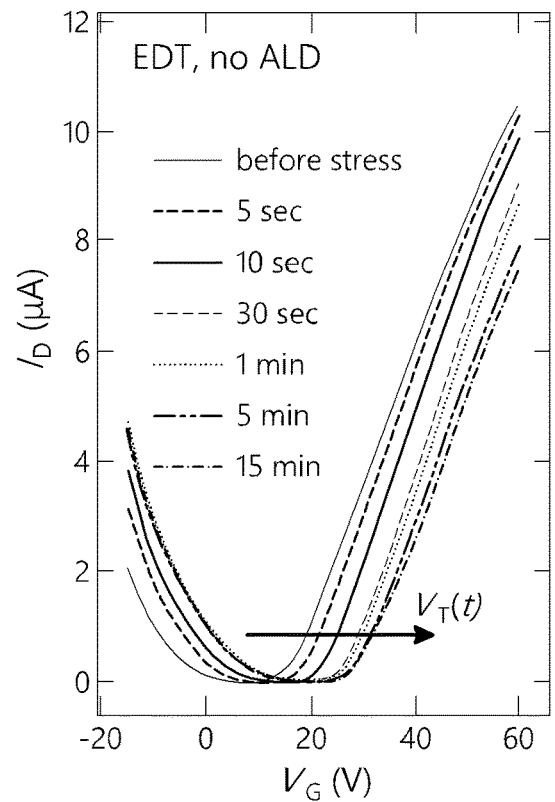
FIG. 2G
FIG. 2H
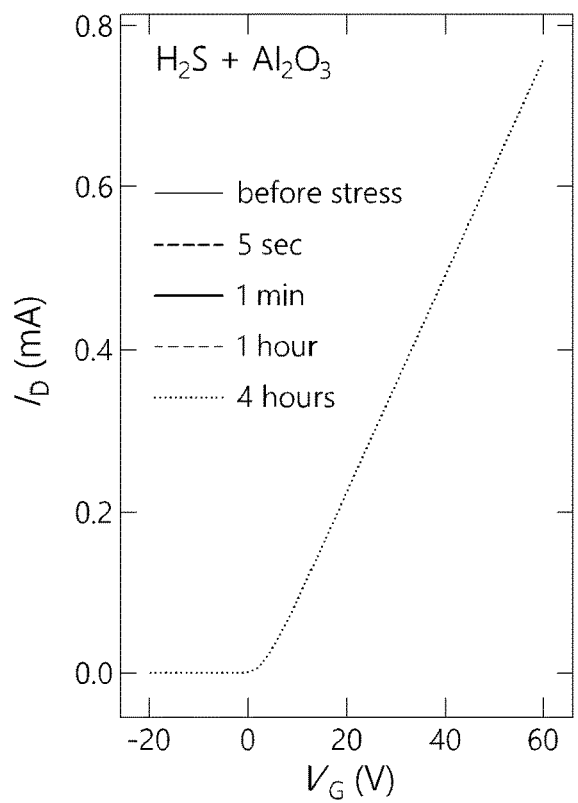

US 10,224,422 B2

METHOD TO FABRICATE QUANTUM DOT FIELD-EFFECT TRANSISTORS WITHOUT BIAS-STRESS EFFECT

STATEMENT REGARDING FEDERALLY SPONSORED R&D

The present disclosure was developed, at least in part, with government support under Grant Nos. DE-SC0003904, awarded by the Department of Energy as well as the Graduate Research Fellowship, awarded by the National Science Foundation. The United States Government may have rights to this disclosure.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the disclosure generally relate to a process for making quantum dot (QD) field-effect transistors (FETs) having little to no bias-stress effect.

SUMMARY

Disclosed herein are embodiments of a method for reducing or eliminating bias-stress effect in a quantum dot field-effect transistor (QD FET), the method comprising exposing at least one quantum dot in a QD FET to a substance, wherein the substance is configured to modify a surface of the at least one quantum dot to reduce charge trapping and/or ion motion, thereby reducing or eliminating bias-stress effect in the QD FET.

In some embodiments, exposing can at least partially remove ligands from the surface of the at least one quantum dot. In some embodiments, the method can further comprise depositing an infilling material over the surface of the at least one quantum dot. In some embodiments, exposing can remove ligands from the surface of the at least one quantum dot, and replaces the ligands with shorter ligands. In some embodiments, the substance can be selected from $H_2S$ or $H_2O$.

Also disclosed herein are embodiments of a method for reducing or eliminating bias-stress effect in a quantum dot field-effect transistor (QD FET), the method comprising exposing a plurality of quantum dots in a QD FET to a first material that at least partially removes ligands from the surface of the QD FET, and depositing a second material onto the plurality of quantum dots to infill and overcoat the plurality of quantum dots, wherein the bias-stress effect in the QD FET is thereby reduced or eliminated.

In some embodiments, the ligands can be fully removed. In some embodiments, the first material can be $H_2S$ or $H_2O$. In some embodiments, the first material can be a gas or vapor. In some embodiments, the first material can be a liquid. In some embodiments, the second material can be a metal oxide or a metal sulfide. In some embodiments, the second material can be alumina.

In some embodiments, depositing can comprise atomic layer deposition. In some embodiments, depositing can comprise vapor or liquid exposure. In some embodiments, depositing can comprise spin coating, spraying, dip coating, or any other solution-based deposition method.

In some embodiments, the second material can prevent gases and gas mixtures from reaching an active layer of the QD FET and arrests internal diffusion of atoms, ions, and molecules within the QD FET. In some embodiments, the plurality of quantum dots can comprise PbSe, PbS, PbTe, CdSe, CdTe, or CdS quantum dots.

Also disclosed herein are embodiments of a QD FET with reduced bias-stress effect, the QD FET comprising a plurality of quantum dots, and an inorganic or organic matrix surrounding the plurality of quantum dots, wherein the QD FET has a reduced bias-stress effect compared to a QD FET without the organic or inorganic matrix.

In some embodiments, the plurality of quantum dots can have reduced ligands as compared to a QD FET without the organic or inorganic matrix. In some embodiments, the QD FET can have enhanced stability when exposed to air as compared to a QD FET without the inorganic or organic matrix.

Also disclosed herein are embodiments of a semiconductor device comprising the QD FET disclosed herein.

Disclosed herein is a method for reducing or eliminating the bias-stress effect in a quantum dot field-effect transistor (QD FET), the method comprising providing a QD FET, exposing the QD FET to a first material that removes ligands, such as volatile ligands, from the surface of the QD FET, and depositing a second material onto the QD FET to infill and overcoat the QD FET, whereby the bias-stress effect in the QD FET is reduced or eliminated.

In some embodiments, the first material can be an acidic or basic material. In some embodiments, the first material can be $H_2S$ or $H_2O$. In some embodiments, the first material can be a gas or vapor. In some embodiments, the first material can be a liquid. In some embodiments, the ligands can comprise small organic or inorganic molecules or ions, including but not limited to EDT, $HCO_2^-$, or $SCN^-$. In some embodiments, the ligands can comprise large organic or inorganic molecules or ions. In some embodiments, the second material can be an inorganic layer, including but not limited to metal oxides (aluminum oxide, zinc oxide, hafnium oxide, etc.) or metal sulfides (zinc sulfide, cadmium sulfide, etc.). In some embodiments, the second material can be an organic layer.

In some embodiments, depositing can comprise atomic layer deposition. In some embodiments, depositing can comprise vapor or liquid exposure. In some embodiments, depositing can comprise spin coating, spraying, dip coating, or any other solution-based deposition method. In some embodiments, the coating can prevent gases and gas mixtures including air from reaching the active layer of the QD FET. In some embodiments, the coating can arrest internal diffusion of atoms, ions, and molecules within the QD FET. In some embodiments, the QD FET can comprise PbSe, PbS, PbTe, CdSe, CdTe, or CdS quantum dots. In some embodiments, the QD FET can comprise other types of quantum dots. In some embodiments, the bias-stress effect in the QD FET can be eliminated.

Also disclosed herein are embodiments of a QD FET without bias-stress effect, the QD FET comprising a plurality of quantum dots and an inorganic or organic matrix surrounding the plurality of quantum dots, wherein the plurality of quantum dots do or do not have volatile ligands, and wherein the QD FET free of bias-stress effect.

Also disclosed herein is a semiconductor device which can be formed by the disclosed method and can incorporate the disclosed QD FET.

BRIEF DESCRIPTION OF THE DRAWINGS

FIGS. 2A-J show testing results for embodiments of transient-free QD FETs and examples using EDT-capped PbSe QD films.

DETAILED DESCRIPTION

Figure 1:
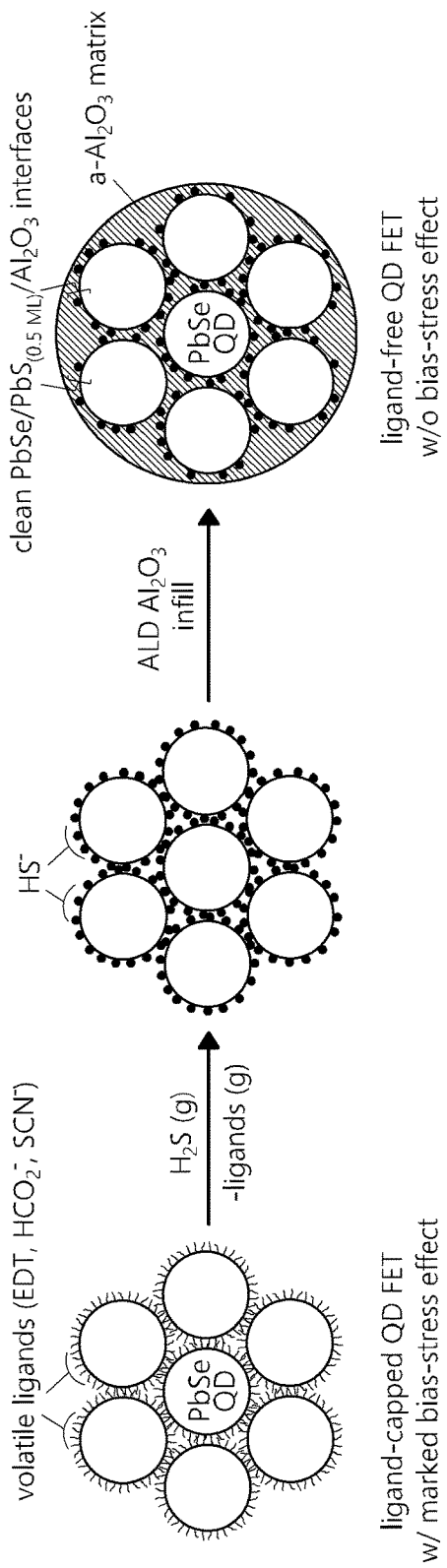
FIG. 1 shows an embodiment of a method to make QD FETs with reduced or no bias-stress effect.

Disclosed herein are embodiments of a method to make quantum dot (QD) field-effect transistors (FETs) that can be free of the bias-stress effect (i.e., decay of the transistor current due to screening of the applied gate voltage by a variety of mechanisms, including trapped charge), or can have reduced bias-stress effect. Other names that can be used as well are bias-stress effect free, transient free, non-hysteretic, hysteresis free, or no time-dependent drain current. Bias-stress effect, discussed in more detail below, is a ubiquitous feature of QD FETs that can make them unusable for practical purposes. In some embodiments, the bias-stress free QD FETS can occur either through the removal of ligands (or the protonation of ligands), or through sufficient reduction of charge trapping. The QD FETs can be formed by conventional approaches, such as atomic layer deposition.

Specifically, the bias-stress effect can be eliminated by modifying the surface of the QDs in order to eliminate surface states, ligands, and ionic motion that can cause the bias-stress effect. Further, they can manage ligand concentrations, passivate QD surfaces, and arrest ion motion. As discussed herein, one embodiment for such an approach is to remove ligands from QDs following by an infilling strategy. In some embodiments, long ligands can be exchanged for short ligands. In some embodiments, either one of ligand removal/exchange or infilling can be used to reduce or remove the bias-stress effect.

Embodiments of the disclosed method can make QD FETs free of the bias-stress effect while also having carrier mobility of at least 15 $cm^2$ $V^{-1}$ $s^{-1}$ (about 15 times better than amorphous silicon) and unprecedented indefinite environmental stability. Accordingly, embodiments of this disclosure can be advantageous for making QD transistors a practical technology. Semiconductor devices, particularly thin film transistors (such as those used to drive LCD displays) and optoelectronics such as photodetectors/diodes and solar cells can benefit from QD active layers that are free from time-dependent currents caused by bias stress as discussed herein.

FETs, also known as thin-film transistors, are transistors containing at least one charge carrier channel throughout a semiconductor material, and an electric field that can be used to control the carrier concentration, and thus the electrical conductivity, of that channel. Charge carriers (electrons or holes) can flow between a source and a drain electrode via the transistor channel. Source and drain terminals can be connected to the semiconductor material through ohmic or non-ohmic contacts, and the conductivity of the channel can be modulated by the potential applied to the gate and source/drain electrodes.

Typically, FETs include three different terminals (electrodes): a source, drain, and gate. Carriers can enter the channel through the source/drain, can leave the channel through the drain/source, and the gate terminal can modify the channel conductivity. However, in some embodiments the FETs can have a fourth terminal (known as a body, base, bulk, or substrate) which can serve to bias the transistor during operation.

In some embodiments, FETs can involve a single-carrier- or dual-carrier-type operation. FETs can be formed into a number of different types and geometries, with various numbers of electrodes and gate geometries, gate dielectric materials, etc., and disclosed herein are embodiments of a QD FET, though the disclosure is not so limited.

Solution-processed field-effect transistors have emerged as promising devices for many different applications, such as, but not limited to, driving flexible displays and chemical sensing. Short- and long-term stability of these transistors is essential for commercial applications. Much progress has been made in the development of quantum dot transistors with charge carrier mobilities reaching up to 30 $cm^2$ $V^{-1}s^{-1}$. However, their operational and environmental instability still remains an important problem that prevents commercial applications.

A very undesirable feature of all previous quantum dot transistors is that when these transistors are operated, their electrical characteristics change with time even at fixed applied bias. For example, if these transistors were to be used to drive a pixel in a video display to switch on a current, the current will decay and switch off after a short time. The problem is usually caused by the trapping of charge near the semiconductor-dielectric interface or in the semiconductor material. As trapped charge accumulates with time, it screens (reduces) the applied electric field felt by free charges in the transistor channel, with the following deleterious consequences: (1) the current decays with time; (2) the threshold voltage increases with time, since a larger voltage is required to achieve a given channel conductivity in the presence of the trapped charge. This phenomenon is called the bias-stress effect (i.e., the applied bias acts is a stressor that causes undesired time-dependent changes in the transistor). In some embodiments, the bias-stress effect can manifest as time-dependent drain currents.

Although the general cause of the bias-stress effect is known to often be trapping of immobile charge (electronic or ionic) near or on the surface of the gate dielectric, the exact cause can vary between technologies (e.g., amorphous silicon, organics FETs, QD FETs). Trapping can occur within the dielectric layer, on the surface of the dielectric, in states at the interface, or in the semiconductor itself, and it can be reversible or irreversible and due to preexisting traps or traps created by application of the gate field. The bias-stress effect is a ubiquitous problem in thin-film transistors. All QD transistors published to date show the bias-stress effect. Previously, the origin of the bias-stress effect in QD FETs was not known. Since these QD FETs have unstable currents, they cannot easily be used in practical applications such as displays.

There have been no existing solutions to eliminate bias-stress effect in QD transistors. To minimize it, researchers have done the following: (1) modify the dielectric surface in an empirical attempt to lower the trap density. This approach is borrowed from the organic electronics community and does not work well; (2) use a different dielectric. This approach sometimes reduces but never eliminates the effect; (3) operate the transistor at low temperature, which freezes out the effect. Low-temperature operation is not practical for most technologies. None of these approaches eliminates the bias-stress effect in QD FETs. Furthermore, none of the approaches that work for other technologies is effective for QD FETs.

Reducing or Eliminating Bias-Stress Effect

Disclosed herein are embodiments of a general method (or methods) to reduce or completely eliminate the bias-stress effect in quantum dot field-effect transistors. The resulting devices formed using embodiments of the disclosed method can combine the following features: (1) totally stable currents free of bias-stress effect; (2) indefinite environmental stability (years or longer); (3) high carrier mobility (at least about 15 cm$^2$ V$^{-1}$ s$^{-1}$ for electrons). These transistors can be used in a number of different devices, for example such as displays and photo-sensors, as well as logic, computation, and memory technologies. Generally, disclosed herein are methods for removing ligands from QDs as well as infilling the QDs, thereby reducing or removing the bias-stress effect.

In some embodiments, the QD FET can be environmentally stable for greater than about 0.1, 0.5, 1, 1.5, 2, 2.5, 3, 3.5, 4, 4.5, or 5 years. In some embodiments, the QD FET can be indefinitely stable, and thus can have no time limit. In some embodiments, the QD FET can have environmental stability greater than a QD FET that did not undergo the disclosed procedure.

In some embodiments, the QD FETs can have a carrier mobility of at least 1, 5, 10, 15, 20, 25, 30, 40, 50, 60, 70, 80, 90, 100, 200, 300, 400, or 500 cm$^2$ V$^{-1}$ s$^{-1}$ for electrons. In some embodiments, the QD FET can have a carrier mobility greater than a QD FET that did not undergo the disclosed procedure.

In some embodiments, the QD FET can have no bias-stress effect. In some embodiments, the disclosed method can produce a QD FET with less than about 5%, 3%, 2%, or 1% current decay. In some embodiments, the QD FET can have 0% current decay. Other methods of showing the lack of bias stress are (i) drift in current from its initial value with time, (ii) shift in threshold voltage with time. In some embodiments, the QD FET can have less of a bias-stress effect than a QD FET that did not undergo the disclosed procedure.

In some embodiments, the method for eliminating bias-stress effect can involve the following steps (and may only include one of the steps or both of the steps) as illustrated in FIG. 1.

First, a QD FET can be fabricated, and the particular method of fabricating the QD FET is not limiting. As a non-limiting example, the QD FET can be fabricated using conventional ligand exchange with an organic or inorganic ligand. The ligands can be small or large molecules and/or ions as well. In some embodiments, the QDs can be PbS, PbS, PbTe, CdSe, CdTe, or CdS, InP, ZnS, ZnSe, ZnTe, HgTe, HgS, CuInS$_2$, CuIn$_x$Ga$_{(1-x)}$Se$_2$, ZnO, TiO$_2$, Si, Ge, and any elemental or compound semiconductor, though the particular QDs are not limiting. The ligands can adhere to the surface of the QDs as shown in FIG. 1, and can be volatile ligands such as, for example, EDT, HCO$_2^-$, or SCN$^-$. In some embodiments, the ligands may not be volatile. Other ligands can include halides, amines, hydrazine, thiols, carboxylates, phosphonates, sulfonates, and inorganic ions.

Following, the QD FET can be briefly exposed to a gas, liquid, or vapor to remove the ligands on the surface of the QD as shown in FIG. 1. In some embodiments, the FET can be placed in a vessel/chamber, and then the gas, vapor, or liquid can be introduced into the vessel/chamber. If a gas is used, a valve can be opened to bathe the FET in gas. If a liquid is used, the FET can be put into a vial containing the liquid. However, the method of exposure is not limiting. In some embodiments, the gas or liquid can be H$_2$S, though other substances can be used as well, such as H$_2$O, or an acidic or basic material. While H$_2$O is a weaker acid than H$_2$S, a larger dose can still protonate and remove ligands from the QDs. For example, a "normal" dose may be 3×10$^6$ whereas a "large" dose can be 3×10$^7$. Other related examples that can work for embodiments of the disclosure of "ligand that becomes volatile upon protonation+acid treatment" would be H$_2$Se, H$_2$Te, HI, HBr, HF, HCl, though many other substances can be used as well. In some embodiments, exposure to H$_2$S gas can be used to protonate and/or remove, in some cases completely removing, ligands such as EDT, formate, or thiocyanate from the surface of the QDs. In some embodiments, ligands can float away into a solution used to remove the ligands.

In some embodiments, greater than 80%, 90%, 95%, 98%, 99% or 100% of volatile organic ligands are removed after interaction with the gas, liquid, or vapor.

During the removal of the volatile ligands using the H$_2$S, the ligands can be replaced with HS$^-$, which can surround the QDs as shown in FIG. 1.

In some embodiments, after removal of the ligands, atomic layer deposition (ALD), such as low-temperature atomic layer deposition, or another gas, vapor, or solution method can be used to coat/encapsulate/infill the QDs with a second material, such as an inorganic or organic matrix shown in FIG. 1. However, in some embodiments the ALD procedure is not performed, and ligand removal is sufficient to remove the bias-stress effect. Other methods can be used as well, such as vapor or liquid exposure, spin coating, spraying, dip coating, or other solution-based deposition methods. In some embodiments, the second material can be a metal oxide or a metal sulfide. In some embodiments, the second material can be Al$_2$O$_3$ (alumina). If the infill method were used, in principle any material that can be deposited by ALD could work, and thus the infilling material is not limiting. In some embodiments, the QD FET is completely infilled with the infilling material. Thus, the QDs would form a continuous film and no islands would be left over.

Deposition of alumina by low-temperature atomic layer deposition (ALD) then results in a ligand-free, atomically-clean PbSe/PbS/Al$_2$O$_3$ interface and a QD FET with negligible bias-stress transients at room temperature. PbS (lead sulfide) can be formed at the interface between the PbSe and alumina. This can occur because H$_2$S is used to treat the QDs, resulting in sulfide at the surface. Some of this sulfide can be buried under the alumina, giving a partial monolayer of PbS. Further, the second material can prevent gases and/or gas mixtures from reaching an active layer of the QD FET. This has been measured for stability in air, and embodiments of the devices are indefinitely stable when stored in air. In some embodiments, the second material can arrest internal diffusion of atoms, ions, and molecules within the QD FET.

In some embodiments, the original small molecule ligand can be removed by the first material exposure and, for example, replaced by HS$^-$. Then, during the alumina ALD, the HS$^-$ can be subsumed into the inorganic matrix. Thus, in the end the QDs have PbSe/PbS/alumina, and HS$^-$ units cease to exist and the final film is ligandless. Treatments other than $H_2S$ may do pure removal, or substitution, depending on details. However, the removal of ligands and/or the infilling procedure can be done with any number of methods, and the particular examples disclosed herein are not limiting.

Embodiments of the disclosed method can enable quantum dot transistors to achieve indefinite environmental stability without device degradation under ambient and operating conditions, immunity against sustained gate-bias stress, and high carrier mobility. This stability can be the result of ligand removal, the generation of an atomically clean, high-quality, and low-defect-density interface between the QDs and the inorganic/organic coating material, and the closure of void space within the QD film that otherwise acts as channels for ion drift in the applied field. As mentioned, bias-stress effect can be caused by charge trapping and/or ligand conformational changes at the QD surface, plus motion of protons on the QD surface in response to applied fields. By removing ligands and surface states and cutting off routes for surface diffusion, the transient currents can be stopped.

Furthermore, the inorganic/organic coating layer can act as (1) an excellent gas diffusion barrier, preventing air and other gases from reaching the FET active layer, and (2) an internal matrix that arrests internal diffusion of atoms, ions, and molecules within the transistor. Further, the matrix can passivate surface states of the QD, can decrease the barrier height and Ec, and can prevent QD oxidation/degradation. These factors can result in the elimination of bias-stress effect and environmental instability. For example, by reducing/removing external and internal diffusion, QD oxidation can be stopped, along with proton motion. Embodiments of the disclosure can be advantageous to make practical QD transistors for many different technologies, including, but not limited to, transistors for logic, memory, or to drive displays, LEDs, photodetectors/diodes, and other optoelectronic devices based on QD films.

In some embodiments, charge trapping and ion motion on QD surfaces can be stopped by removing ligands (or reducing the size of the ligands) and forming a clean PbSe/PbS/alumina interface (or similar interface). Further, in some embodiments proton migration can be stopped by "full" infilling of the QDs, which closes off pathways for ion motion. The reduction of these mechanisms allows the QD FETs to be bias-stress effect free.

Devices

Disclosed below are some devices that were fabricated by embodiments of the above method, though other types devices can be fabricated as well and the particular device using QD FETs are not limiting. Accordingly, disclosed is a manifestation of an embodiment of the method using PbSe QDs, $H_2S$ to remove the ligands, and alumina infilling.

Gate Dielectric 200 nm of thermally grown $SiO_2$ on $p^{++}$ degenerate silicon purchased from WaferNet Inc. served as the gate dielectric and gate electrode respectively, though other materials can be used as well. Prior to thin film deposition, bottom metal contacts were photolithographically patterned with an electrode geometry defined as channel widths of 1000 μm and channel lengths of 5, 10, and 25 μm. These metal contacts act as low resistance contacts to the quantum dot films and are made by electron beam evaporation where a 1 nm thin titanium adhesion layer and 35 nm of gold are deposited on the substrates.

Quantum Dot Thin Film

Prior to quantum dot thin film deposition, FET substrates were cleaned with 1) 10% v/v Hellmanex® II solution by sonication for 15 minutes, 2) DI water sonication for 15 minutes, 3) thoroughly rinsed with ethanol and 4) Isopropyl alcohol sonication for 15 minutes. Once the substrates were cleaned, quantum dot thin films were prepared by a layer-by-layer (LbL) dip coating deposition technique. This procedure comprises alternately contacting the FET substrate with a colloidal solution of quantum dots and contacting the substrate with a volatile ligand exchange chemical such as formic acid, mercaptopropionic acid, ethanedithiol, or ammonium thiocyanate, though it will be understood that other procedures could be used as well.

$H_2S$ Exposure and Atomic Layer Deposition:

The step of exposing the initial QD film with $H_2S$ gas may include multiple exposures in order to volatilize the ligands and successfully do an in-vacuo ligand exchange with the previous ligand and with $H_2S$. The exposure can be one big dose, or several smaller doses. In the same deposition chamber (or in a different chamber), amorphous aluminum oxide (alumina) can be deposited via ALD at a deposition temperature no greater than about 75° C. to prevent unwanted sintering of the QD film. Note that other ALD sequences also work, the method is not limited to just $H_2S$ and alumina. Further, the method is not limited to these QDs or ALD treatments.

Results

All device characteristics were measured in a dry $N_2$ atmosphere ($O_2$<1 ppm) using a Keithley 2636 source-measure unit driven by Labview software.

The surprising and superior performance of these devices compared to devices without the $H_2S$ exposure and alumina infilling is shown in FIGS. 2A-J.

FIGS. 2A-J illustrates (a) output and (b) transfer I-V characteristics of an EDT-capped PbSe QD FET. The (c) output and (d) transfer curves after one pulse of $H_2S$ gas in an ALD chamber followed by (e-f) infilling and overcoating with ALD $Al_2O_3$. An electron mobility of 4.0 cm$^2$ V$^{-1}$ s$^{-1}$ was measured for the infilled FET in the linear regime. QD diameter=6.3 nm; QD film thickness=30-40 nm; alumina thickness=20 nm; ALD temperature=54° C. Channel dimensions: length=25 μm; width=1000 μm. Sweep rates=50 V/s. T=298 K. (g-h) Transfer plots of a FET before and after the process, showing elimination of the bias-stress effect. (i) Log-linear plots of $|I_D|$ versus time for these FETs at $|V_{SD}|$=5 V. Labels denote $|V_G|$. (j) Plot of normalized $I_D$ versus time for FETs. The bias-stress effect (IV transient) is negligible after the $H_2S$+alumina treatment. All data acquired in an $N_2$-filled glove box.

Thus, FIGS. 2A-J show a typical QD FET characteristics using 1,2-ethanedithiol (EDT) as the ligand treatment. (a), (b) shows the output and transfer characteristics of an as-made FET showing hysteresis, a manifestation of the bias-stress effect. (c), (d) shows the output and transfer characteristics of an $H_2S$ exposed QD FET. (e), (f) shows output and transfer characteristics of an $H_2S$ and $Al_2O_3$ infilled device where the forward and reverse sweeps are shown but are indistinguishable over the entire operating range. (g), (h) shows transfer characteristics measures at $V_{SD}$=+5V, $V_G$=+40V prior to stress sequence and after prescribed time for QD FETs with and without ALD.

As shown, embodiments of the disclosed quantum dot field-effect transistors that were tested have no current hysteresis, and extended bias stresses up to 4 hrs, which leads to no changes in the transfer characteristics. When compared to experiments with devices that have not been exposed to $H_2S$ and $Al_2O_3$, when a gate voltage of $V_G$=+40

Figure 2A:
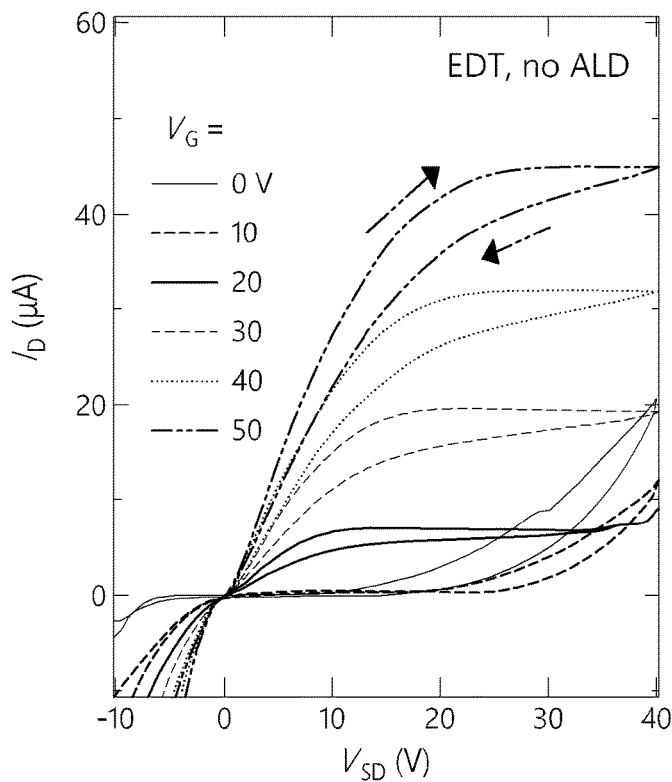
Figure 2B:
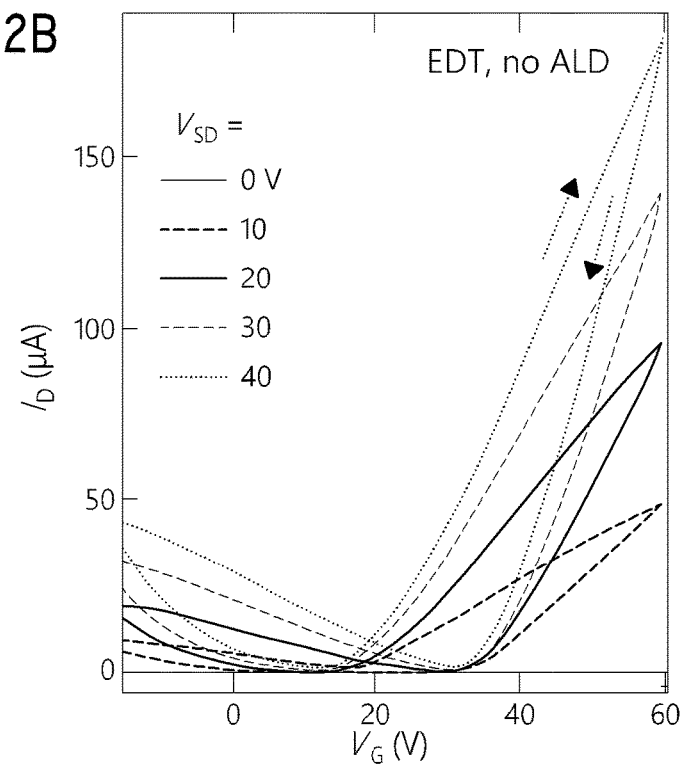
Figure 2C:
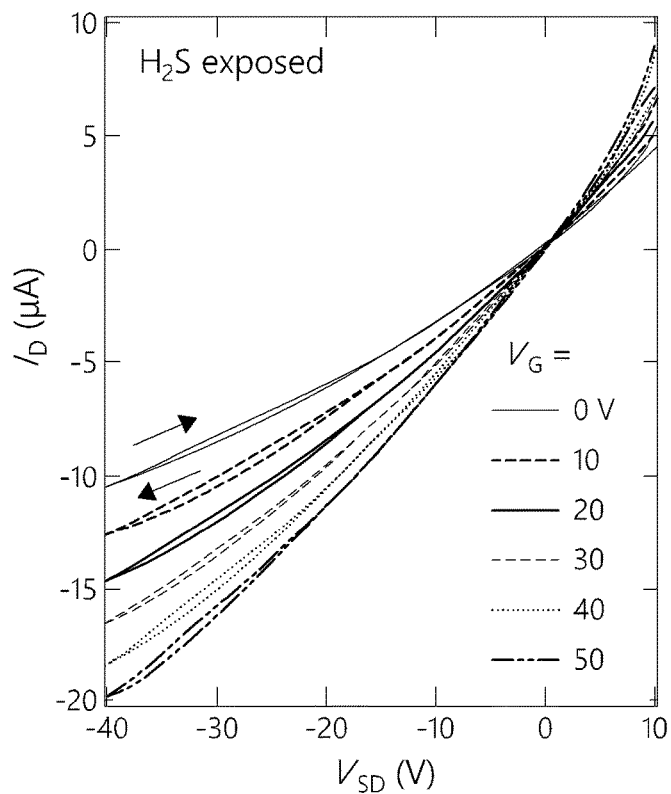
Figure 2D:
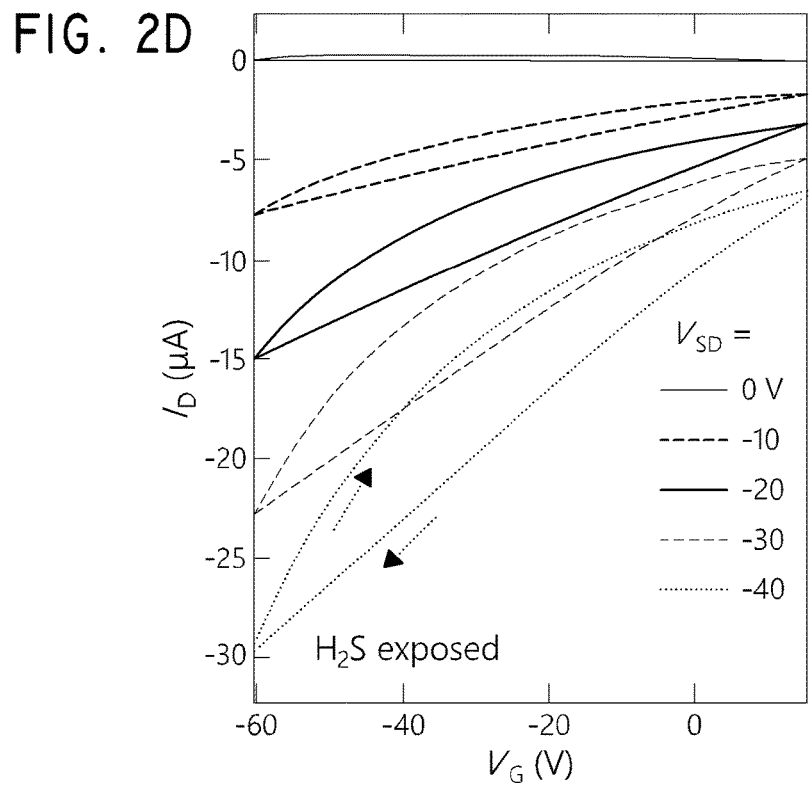
Figure 2E:
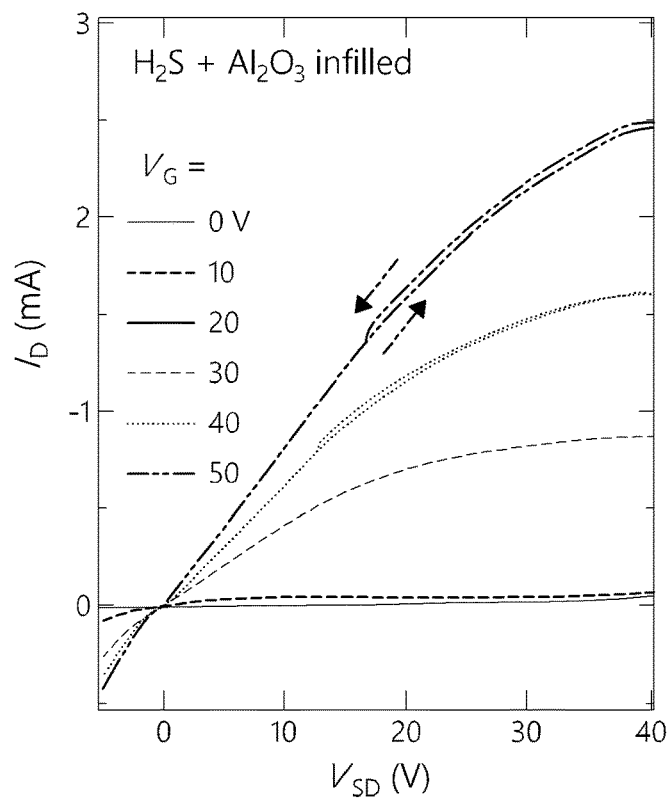
Figure 2F:
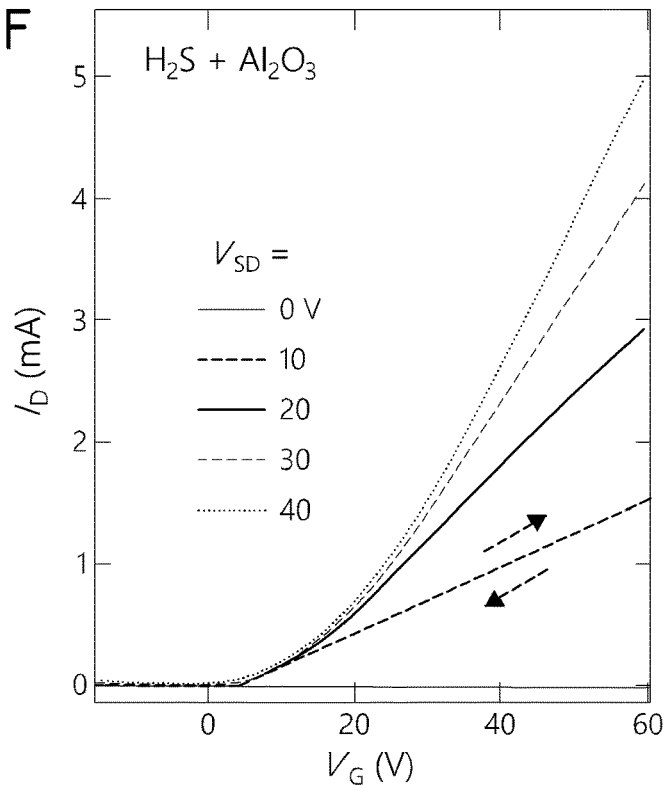
Figure 2I:
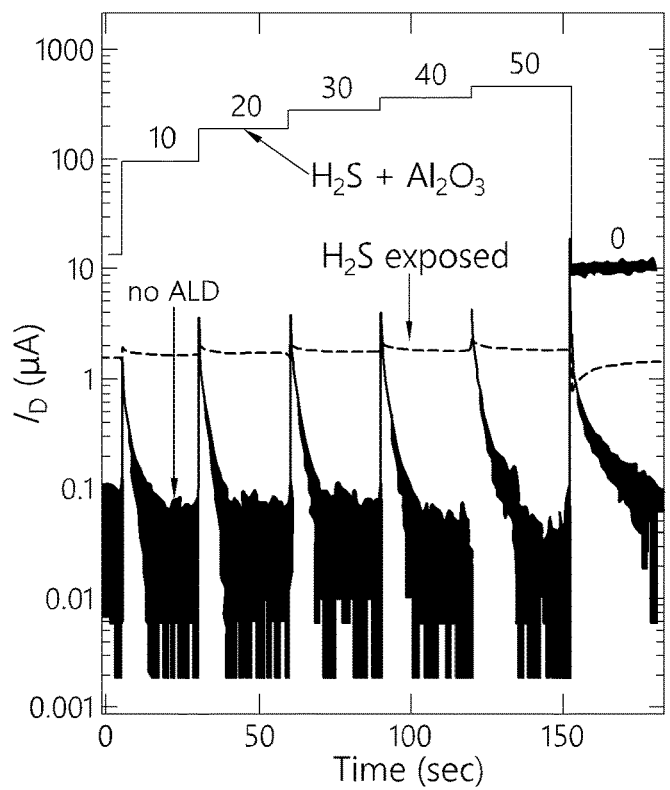
Figure 2J:
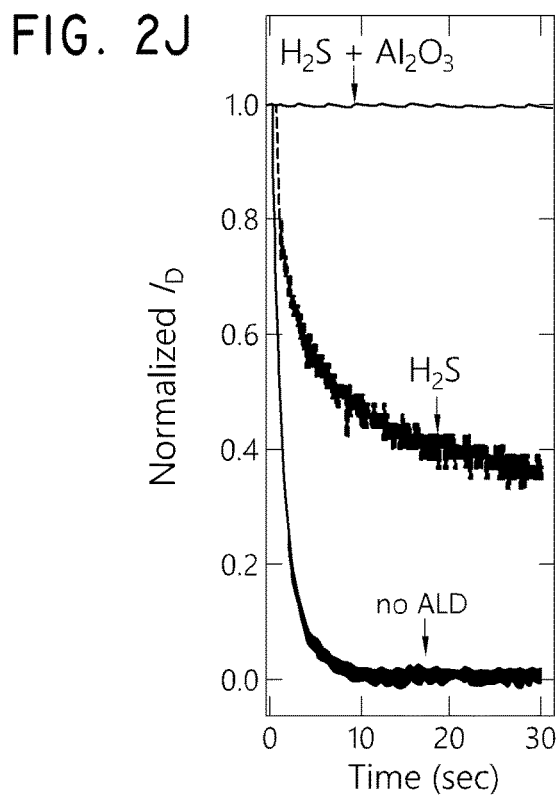

V is applied for up to 15 minutes, the shift of the onset voltage is large (FIG. 2G) and there is a significant decrease in the on-current (FIG. 2J). In contrast, in similar experiments, when the QD FET is exposed to $H_2S$ and $Al_2O_3$ there are no shifts in the onset voltage (FIG. 2H) and there is negligible changes in the on-current (FIG. 2J), demonstrating the impact of embodiments of the disclosure in improving QD FET performance. Longer-term stability tests show completely unchanged current even after days of bias stress, indicating that the bias-stress effect is truly eliminated, not merely reduced, by the described method.

Figure 3A:
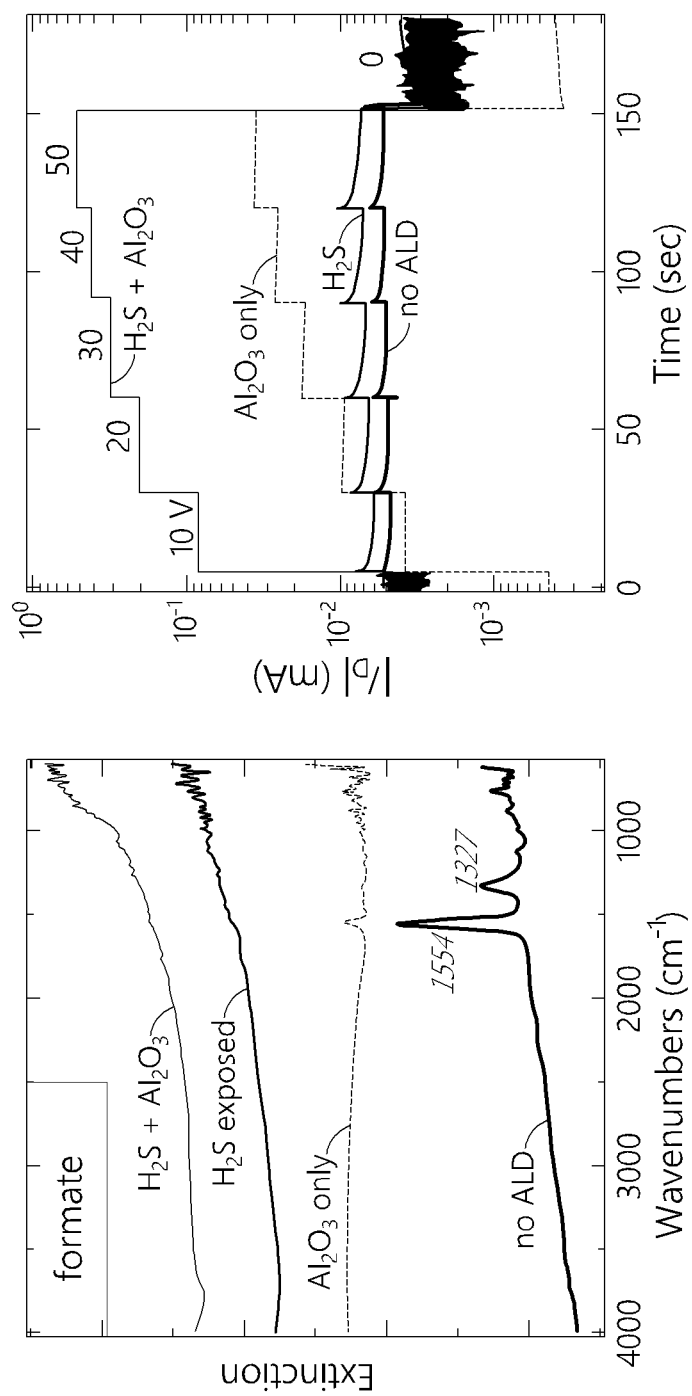
FIGS. 3A-B show testing results of embodiments of volatile ligands which can produce stable FETs.
Figure 3B:
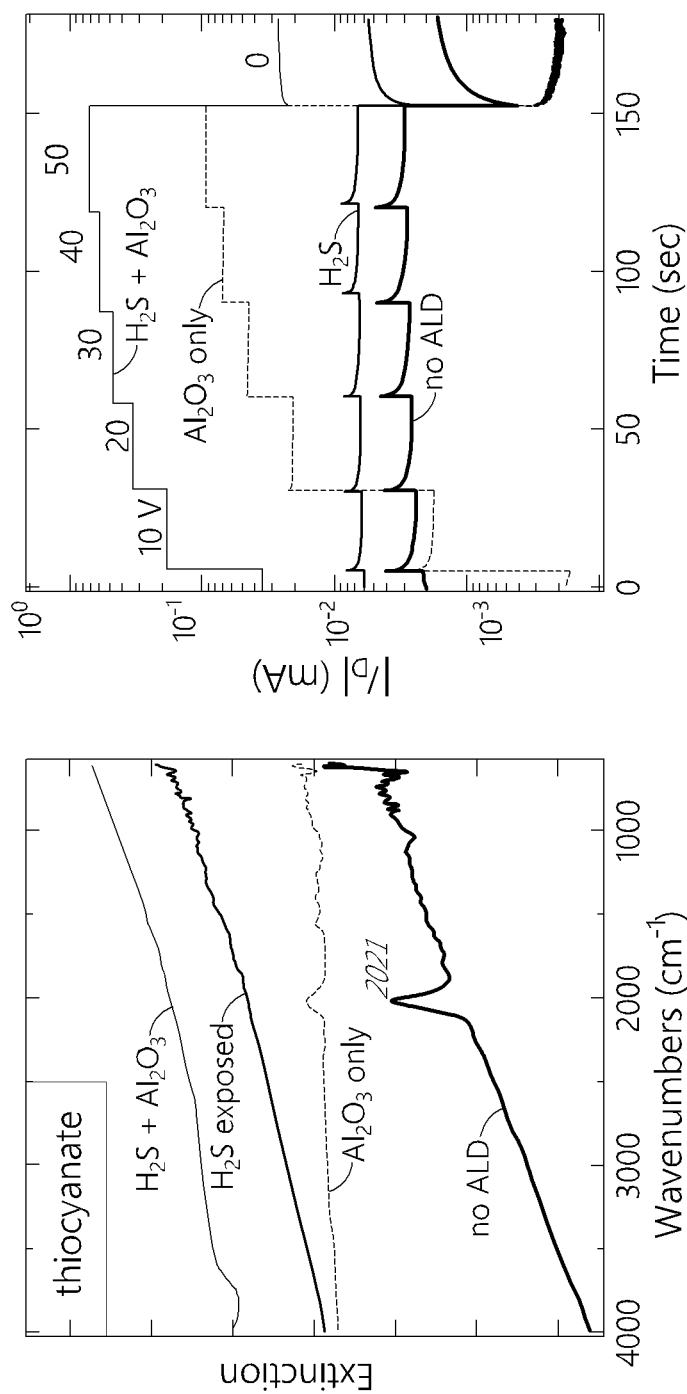

FIGS. 3A-B shows that volatile ligands can produce stable FETs. FTIR spectra and $I_D$ time traces for films made from (a) formate-capped and (b) thiocyanate-capped PbSe QDs. The spectra show complete loss of the small ligand upon exposure of the as-made films to $H_2S$. The $H_2S$ exposed, Alumina-infilled FETs display negligible bias-stress effect as shown due to the flat portions for current in the rightmost graphs in FIGS. 3A-B. $|V_{SD}|=5$ V. Labels on the time traces denote $|V_G|$. All FET parameters are the same as in FIGS. 2A-J.

As mentioned above, according to some embodiments of the disclosure $H_2S$ can be used in order produce devices that are stable against gate bias stress as shown in the main panel of FIG. 4. FTIR spectra and $I_D$ time traces for films made from (a) oxalate-capped, (b) trimesate-capped, and (c) 1,4-benzenedithiolate-capped PbSe QDs. The spectra show that the non-volatile ligands on the as-made films are not removed by $H_2S$ exposure or subsequent alumina infilling, and the $H_2S$ exposed, $Al_2O_3$ infilled FETs show significant $I_D$ transients. $|V_{SD}|=5$ V. This methodology shows that the bias-stress effect can be correlated to the presence of ligands. However, non-volatile ligands can still be removed through embodiments of the disclosure, and non-volatile ligands only remained as volatile ligands would leave the film upon protonation. Labels on the time traces denote $|V_G|$. All FET parameters are the same as in FIGS. 2A-J.

Figure 4A:
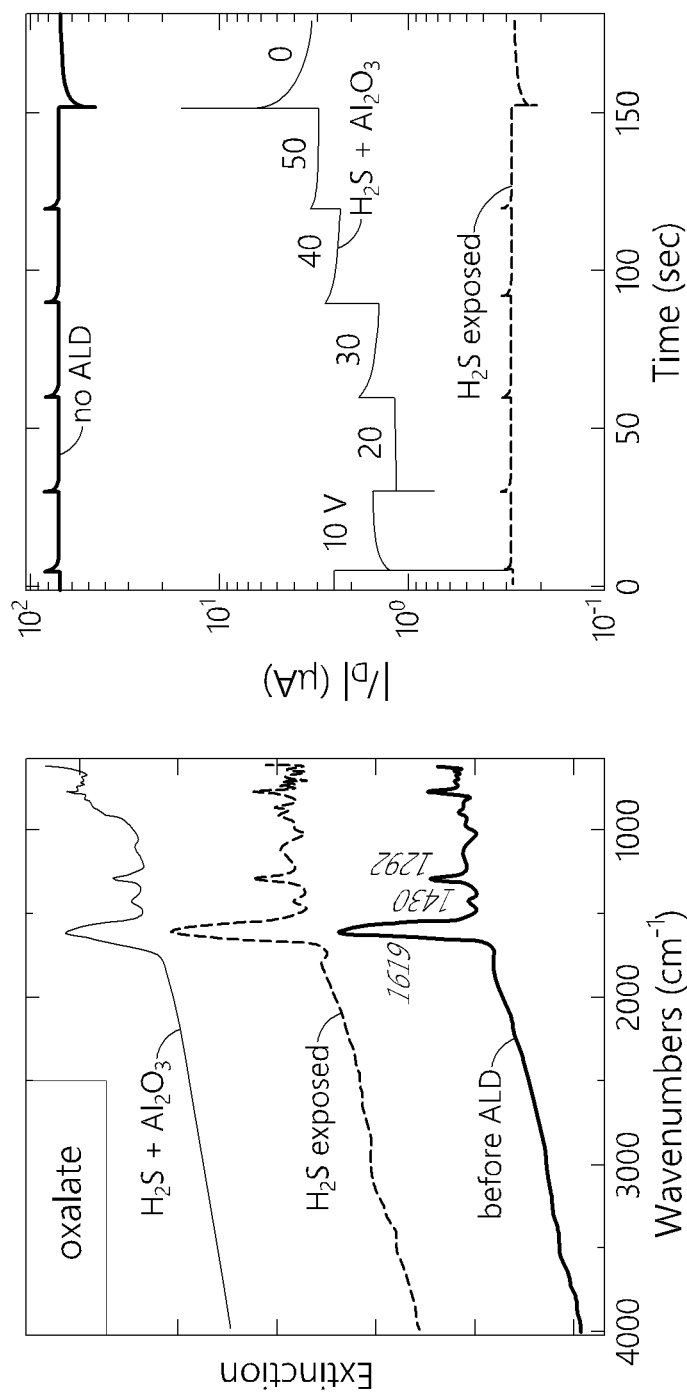
FIGS. 4A-C shows testing results of an embodiment of non-volatile ligands that yield FETs that retain significant bias-stress transients.
Figure 4B:
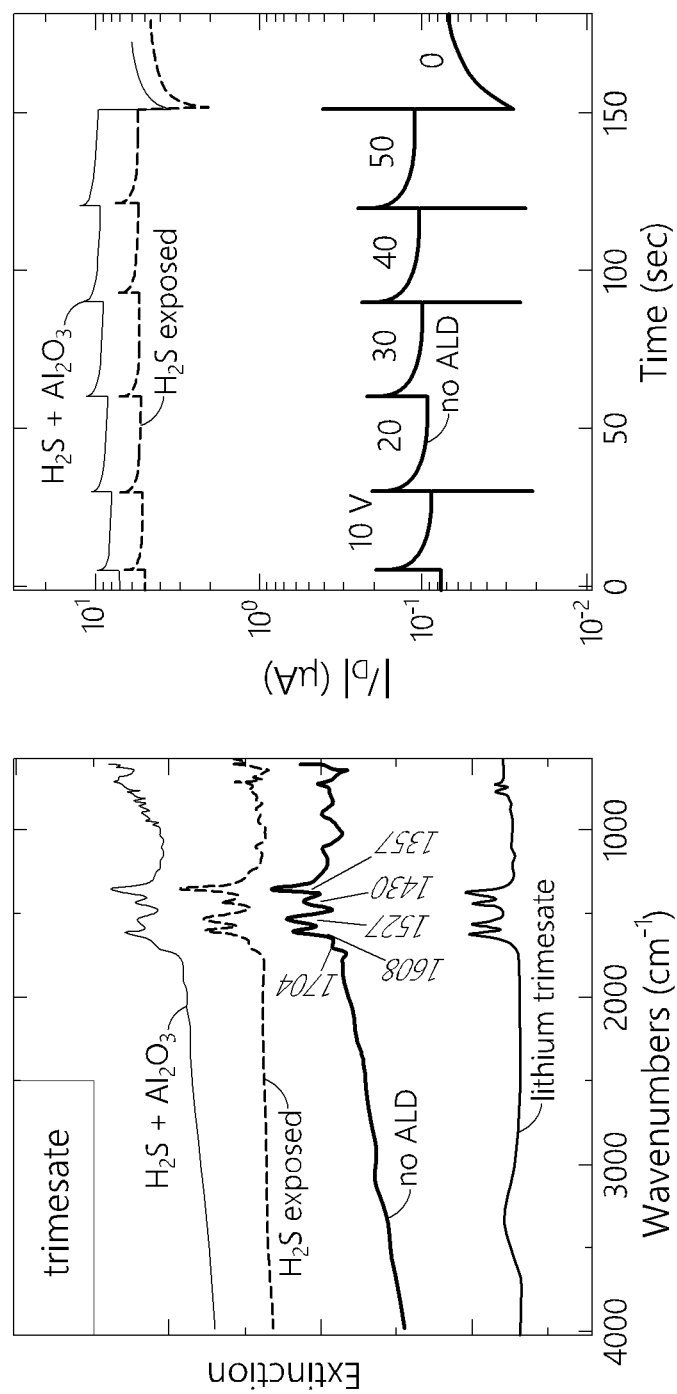
Figure 4C:
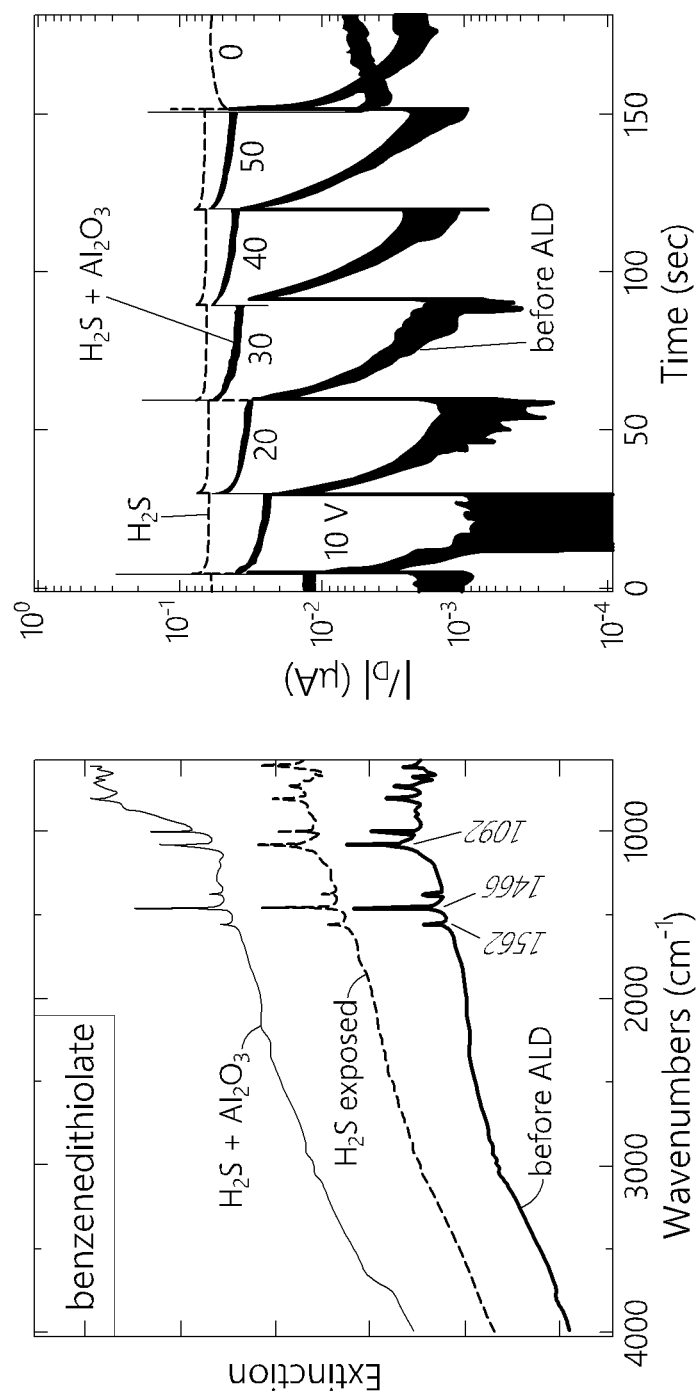

FIGS. 4A-C shows data for oxalate, trimesate, and benzenedithiolate, all of which are not volatile upon protonation. $H_2S$ can be acidic enough to protonate and volatilize ligands that possess high vapor pressures in their protonated (neutral) form, though other acidic chemicals can be used as well. Further, bases can be used if the appropriate ligands are involved. Chemicals with other types of reactivity (basicity, redox, complexing, etc.) can also be used to remove other types of ligands. The disclosure is not limited to volatile ligands and acidic treatments and other methods, such as volatile ligands plus gaseous bases or ligands that desorb during solution treatments can be used as well. Infrared transmission spectroscopy is used to monitor the characteristic vibrational spectrum of the ligand chemicals used in our device fabrication. Using formate and thiocyanate capped QD films, the $H_2S$ can remove the ligand, which experimentally corresponds to the absence of the signature vibrational spectra of the ligand on the QD surface. To further the understanding of this process, ligands with low vapor pressures were used and the bias-stress effects were characterized. As seen in FIGS. 4A-C, using oxalate, trimesate, and benzendithiolate ligands, $H_2S$ exposure does not remove these ligands from the surface of the QD and if same experiments were performed, the devices are not stable against gate bias stress. This suggests that the specific chemical species used to make QD thin films can be detrimental leading to either electrically active trap states or a combination of these states with charge trapping in the gate dielectric.

Figures 5A, 5B:
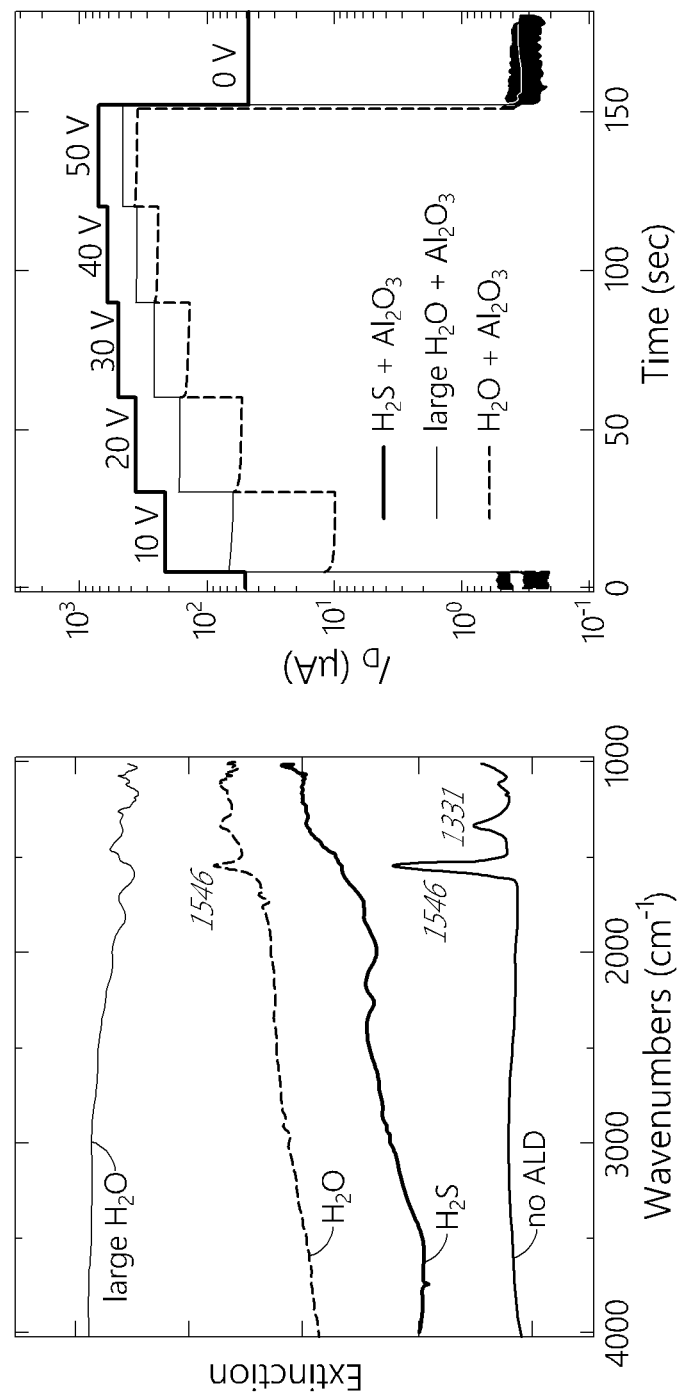
FIGS. 5A-C show testing results comparing $H_2S$ and $H_2O$.
Figure 5C:
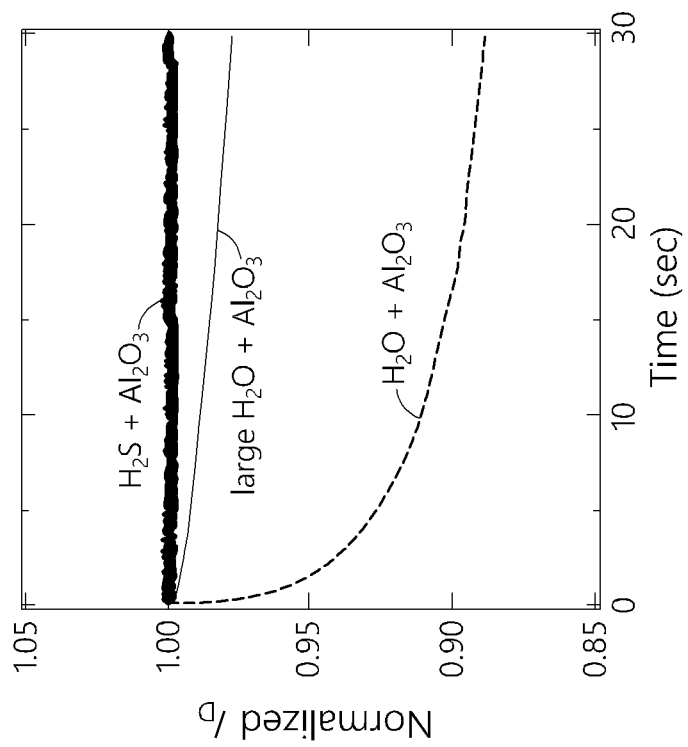

FIGS. 5A-C illustrate some comparative testing between $H_2S$ and $H_2O$. As shown, a larger dose of $H_2O$ can be nearly as effective as $H_2S$.

Embodiments of the disclosed method are the first method to eliminate bias-stress effect in QD transistors. Embodiments of the disclosed method are simple, general, and in principle cheap and fast, and results in the first completely stable, high-performance QD FETs. Since these FET can be infinitely more stable than previous QD FETs and have no stability issues, they may find applications in commercial technologies that utilize large-area, relatively slow transistors, such as displays and low-rate photodetectors.

In some embodiments, the method can be used to form functional transistors with high mobility, air stability, and operational stability (zero bias-stress effect).

Further, embodiments of the disclosure can improve the on/off ratios, subthreshold slope, and low-voltage operation, which can be advantageous for low power consumption devices.

From the foregoing description, it will be appreciated that an inventive methods of forming QD FETs are disclosed. While several components, techniques and aspects have been described with a certain degree of particularity, it is manifest that many changes can be made in the specific designs, constructions and methodology herein above described without departing from the spirit and scope of this disclosure.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Moreover, while methods may be depicted in the drawings or described in the specification in a particular order, such methods need not be performed in the particular order shown or in sequential order, and that all methods need not be performed, to achieve desirable results. Other methods that are not depicted or described can be incorporated in the example methods and processes. For example, one or more additional methods can be performed before, after, simultaneously, or between any of the described methods. Further, the methods may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount. If the stated amount is 0 (e.g., none, having no), the above recited ranges can be specific ranges, and not within a particular % of the value. For example, within less than or equal to 10% of, within less than or equal to 5% of, within less than or equal to 1% of, within less than or equal to 0.1% of, and within less than or equal to 0.01% of the stated amount.

Some embodiments have been described in connection with the accompanying drawings. The figures are drawn to scale, but such scale should not be limiting, since dimensions and proportions other than what are shown are contemplated and are within the scope of the disclosed inventions. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

While a number of embodiments and variations thereof have been described in detail, other modifications and methods of using the same will be apparent to those of skill in the art. Accordingly, it should be understood that various applications, modifications, materials, and substitutions can be made of equivalents without departing from the unique and inventive disclosure herein or the scope of the claims.

What is claimed is:

1. A method for reducing or eliminating bias-stress effect in a quantum dot field-effect transistor (QD FET), the method comprising:
   fabricating at least one quantum dot wherein the quantum dot contains a plurality of anionic ligands;
   introducing the at least one quantum dot into a chamber and exposing the at least one quantum dot to a gas-phase acid of hydrogen sulfide in vacuum, wherein the hydrogen-sulfide is sufficiently strong of a gas-phase acid to protonate the plurality of organic liquids and remove them to form an atomically-clean surface on the at least one quantum dot; and
   coating the at least one quantum dot with amorphous alumina ($Al_2O_3$) at a low temperature to completely infill the at least one quantum dot and overcoat the outside with a continuous film;
   wherein the hydrogen-sulfide and alumina modifies a surface of the at least one quantum dot to reduce charge trapping and/or ion motion by removing all ligands from the QD FET; and
   wherein the exposed at least one quantum dot displays negligible bias-stress effect in the QD FET.

2. The method of claim 1, wherein the QD FET has a carrier mobility of at least 15 $cm^2V^{-1}s^{-1}$.

3. The method of claim 1, wherein the QD FET has less than about 5% current decay.

4. The method of claim 3, wherein the QD FET has 0% current delay.

5. The method of claim 1, wherein the alumina has a thickness of 20 nm.

6. The method of claim 1, wherein the low temperature is below about 75° C.

7. The method of claim 1, wherein the exposing comprises a plurality of doses of the hydrogen sulfide.

8. The method of claim 1, wherein the at least one quantum dot is a PbSe quantum dot.

9. A method for reducing or eliminating bias-stress effect in a quantum dot field-effect transistor (QD FET), the method comprising:
   fabricating a plurality of quantum dots, wherein each of the plurality of quantum dots comprises a plurality of anionic ligands on an outer surface;
   exposing the plurality of quantum dots to a gas-phase acid of hydrogen sulfide that protonates and removes all ligands from the outer surface of each of the plurality of quantum dots to form a plurality of ligandless quantum dots; and
   depositing amorphous alumina ($Al_2O_3$) onto the plurality of ligandless quantum dots to infill and overcoat the plurality of quantum dots;
   wherein the plurality of infilled and overcoated quantum dots are ligand free; and
   wherein the bias-stress effect in the QD FET is thereby reduced or eliminated.

10. The method of claim 9, wherein the depositing comprises atomic layer deposition.

11. The method of claim 9, wherein the depositing comprises vapor or liquid exposure.

12. The method of claim 9, wherein the depositing comprises spin coating, spraying, dip coating, or any other solution-based deposition method.

13. The method of claim 9, wherein the alumina prevents gases and gas mixtures from reaching an active layer of the QD FET and arrests internal diffusion of atoms, ions, and molecules within the QD FET.

14. The method of claim 9, wherein the plurality of quantum dots comprise PbSe, PbS, PbTe, CdSe, CdTe, or CdS quantum dots.

15. The method of claim 9, wherein the QD FET a carrier mobility of at least 15 $cm^2v^{-1}s^{-1}$.

16. The method of claim 9, wherein the QD FET has less than about 5% current decay.

17. The method of claim 16, wherein the QD FET has 0% current delay.

18. The method of claim 9, wherein the alumina has a thickness of 20 nm.

19. The method of claim 9, wherein the depositing is at a temperature below about 75° C.

20. The method of claim 9, wherein the exposing comprises a plurality of doses of the hydrogen sulfide.

* * * * *

UNITED STATES PATENT AND TRADEMARK OFFICE
CERTIFICATE OF CORRECTION

PATENT NO. : 10,224,422 B2
APPLICATION NO. : 14/973522
DATED : March 5, 2019
INVENTOR(S) : Matt Law It is certified that error appears in the above-identified patent and that said Letters Patent is hereby corrected as shown below:

In the Specification

In Column 6, Line 13, change "$3\times10^6$" to --$3\times10^6$ L--.
In Column 6, Line 14, change "$3\times10^7$ ." to --$3\times10^7$ L.--.
In Column 9, Line 60, change "benzendithiolate" to --benzenedithiolate--.

In the Claims

In Column 12, Line 52, Claim 15, after "QD FET" insert --has--.
In Column 12, Line 53, Claim 15, change "$cm^2v^{-1}s^{-1}$." to --$cm^2V^{-1}s^{-1}$.--.

Signed and Sealed this
Twenty-fifth Day of June, 2019

Andrei Iancu
*Director of the United States Patent and Trademark Office*